United States Patent [19]

Kamiya et al.

[11] Patent Number: 5,018,848
[45] Date of Patent: May 28, 1991

[54] LASER BEAM TRANSMITTING APPARATUS

[75] Inventors: Saburo Kamiya; Akikazu Tanimoto, both of Yokohama, Japan

[73] Assignee: Nikon Corporation, Tokyo, Japan

[21] Appl. No.: 236,935

[22] Filed: Aug. 26, 1988

[30] Foreign Application Priority Data

Sep. 4, 1987 [JP] Japan .................. 62-220402

[51] Int. Cl.⁵ .......................................... G02B 23/02
[52] U.S. Cl. .................... 350/572; 350/618
[58] Field of Search ............. 350/572, 573, 574, 576, 350/445, 6.8, 611, 612, 618, 500, 486

[56] References Cited

U.S. PATENT DOCUMENTS

| | | | |
|---|---|---|---|
| 3,586,413 | 6/1971 | Adams | 350/574 |
| 3,625,585 | 12/1971 | Beiser | 350/486 |
| 4,299,438 | 11/1981 | Mihoura | 350/6.8 |
| 4,653,903 | 4/1987 | Torigoe et al. | 355/53 |
| 4,796,038 | 1/1989 | Allen et al. | 354/4 |

Primary Examiner—Bruce Y. Arnold
Assistant Examiner—Ronald M. Kachmarik
Attorney, Agent, or Firm—Shapiro and Shapiro

[57] ABSTRACT

An apparatus for transmitting a laser beam supplied from a laser source to a working apparatus comprises a plurality of reflecting mirrors disposed in series between the laser source and the working apparatus to change the direction of the laser beam, a condensing optical system provided to condense the laser beam on the reflecting surface of the first one of the reflecting mirrors, and a relay optical system including first and second imaging devices disposed between the first reflecting mirror and the second reflecting mirror subsequent thereto in the direction of travel of the laser beam. The first imaging devices is disposed between the first reflecting mirror and the second imaging devices and has a forward focus substantially coincident with the reflecting surface of the first reflecting mirror, and the second imaging device is disposed between the first imaging device and the second reflecting mirror and has a rearward focus substantially coincident with the reflecting surface of the second reflecting mirror.

9 Claims, 3 Drawing Sheets

LASER BEAM TRANSMITTING APPARATUS

BACKGROUND OF THE INVENTION

1. Field of the Invention

This invention relates to an apparatus for supplying a working beam to a working apparatus such as an exposure apparatus used for the manufacture of semiconductive circuit devices, and in particular to an apparatus for transmission a laser beam by the use of a plurality of reflecting mirrors.

2. Related Background Art

For example, as regards a working apparatus using an excimer laser as a light source, the laser and the working apparatus are often disposed in different chambers to protect the working apparatus from discharge noise produced from the laser, dust, etc.

In such a case, it is necessary to effect the transmission of the laser beam from the laser to the working apparatus.

As a prior-art transmitting apparatus, there is one as shown in U.S. Pat. No. 4,653,903 wherein the rectilinearly travelling property of a laser beam is utilized and the laser beam is reflected by a plurality of reflecting mirrors to thereby accomplish the transmission of the laser beam. These reflecting mirrors must all be very strictly adjusted in inclination or angle to accurately transmit the laser beam to the target. However, even the strictly adjusted reflecting mirrors may later get out of order for some reason or other. If the inclination or angle of the reflecting mirrors changes a little, the reflection angle error of the laser beam induced thereby will have a magnitude twice as great as the error angle of the reflecting mirrors. As a result, there has arisen the problem that eclipse or the like of the beam occurs. As the transmission distance becomes greater, the amount of said error tends to increase.

SUMMARY OF THE INVENTION

The present invention has as its object the provision of a beam transmitting apparatus which can accomplish transmission of a laser beam well without causing eclipse or the like of the beam.

The apparatus of the present invention is provided with a condensing optical system for causing a laser beam emitted from a laser source to be condensed on a first reflecting mirror, and a relay optical system having an entrance side lens and an exit side lens and disposed between reflecting mirrors so that the forward focus of the entrance side lens is the position of an entrance side reflecting mirror and the rearward focus of the exit side lens is the position of an exit side reflecting mirror, thereby transmitting the laser beam to a working apparatus.

The laser beam emitted from the laser source is first condensed on the first reflecting mirror by the condensing optical system.

The laser beam is then reflected by the first reflecting mirror and enters the relay optical system.

By the action of this relay optical system, the optical image of the laser beam, for example, the image in the exit opening of the transmission side apparatus or the waist of the beam, is formed on each reflecting mirror and relayed to the working apparatus.

DESCRIPTION OF THE PREFERRED EMBODIMENT

An embodiment of the present invention will hereinafter be described in detail with reference to the drawings.

Figure 1:
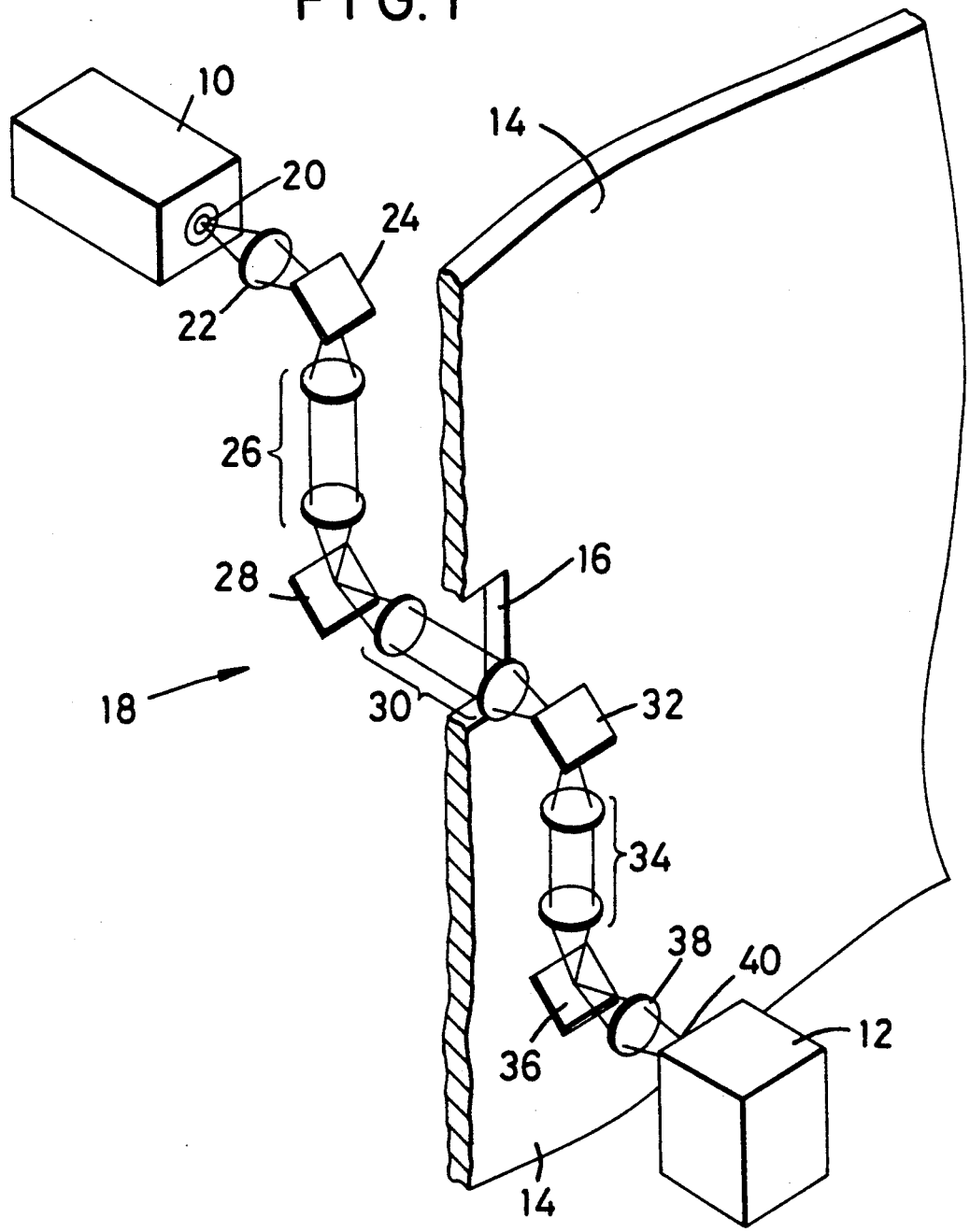
FIG. 1 is a partly broken-away perspective view of an embodiment of the present invention.
Figure 2:
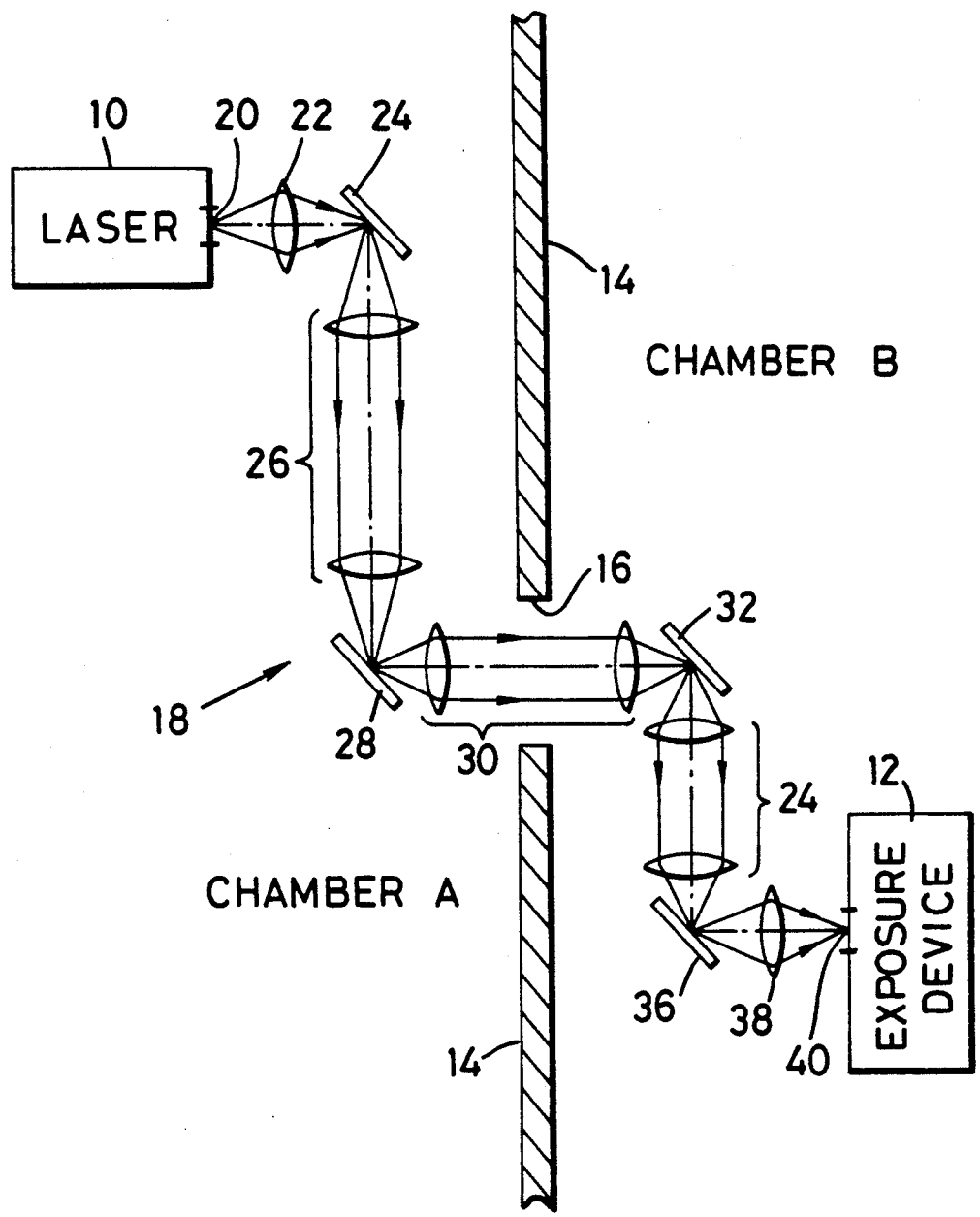
FIG. 2 is a front view of the FIG. 1 embodiment.

Referring to FIGS. 1 and 2, a laser source 10 such as an excimer laser and an exposure device 12 using the laser beam from the laser source 10 to project a mask pattern onto a semiconductor wafer are disposed in separate chambers A and B, respectively, partitioned by a wall 14.

A light-transmitting portion 16 such as a hole is formed in the wall 14. The ,laser beam from the laser source 10 is the exposure device 12 by a system 18 utilizing the light-transmitting portion 16.

Such a transmitting system 18 will now be described. The laser beam emitted from the exit opening 20 of the above-described laser source 10 is first transmitted through a lens 22, enters a reflecting mirror 24 and is condensed on this mirror.

The laser beam reflected by the reflecting mirror 24 is transmitted to the exposure device 12 by the actions of a lens system 26, a reflecting mirror 28, a lens system 30, a reflecting mirror 32, a lens system 34, a reflecting mirror 36 and a lens 38.

By the above-mentioned lens 22, the exit opening 20 of the laser source 10 is imaged on the reflecting surface of the reflecting mirror 24.

The image of the exit opening on this reflecting mirror 24 is relay-formed on the reflecting mirror 28 by the lens system 26, and the image on this reflecting mirror 28 is relay-formed on the reflecting mirror 32, and further, the image on this reflecting mirror 32 is relay-formed on the reflecting mirror 36 by the lens system 34.

The lens systems 26, 30 and 34 each have a first lens and a second lens, and the reflecting surfaces of the reflecting mirrors 24, 28 and 32 are disposed at the forward focus positions, respectively, of the first lenses, and the reflecting surfaces of the reflecting mirrors 28, 32 and 36 are disposed at the rearward focus positions, respectively, of the second lenses.

Also, the reflecting mirror 36 and the entrance opening 40 of the exposure device 12 are in imaging relationship by the lens 38, like the relationship between the exit opening 20 of the above-described laser source 10 and the reflecting mirror 24.

As described above, consideration is given to the arrangement of various portions so that the exit opening 20 of the laser source 10, the reflecting surfaces of the reflecting mirrors 24, 28, 32 and 36 and the entrance opening of the exposure device 12 are all optically conjugate. Thus, the image of the exit opening 20 of the laser source 10 is formed on the entrance opening 40 of the exposure device 12.

For example, the exit side mirror constituting an optical resonator corresponds to the exit opening 20 of the laser source 10, and for example, a fly-eye lens, the opening of a beam shaping optical system, a speckle removing vibratory mirror or the like corresponds to the entrance opening 40 of the exposure device 12.

The operation of the embodiment as described above will now be described.

The laser beam condensed on the reflecting surface of the reflecting mirror 24 by the lens 22 is reflected by the reflecting mirror 24 and enters the first lens of the lens system 26. Since the reflecting surface of the reflecting mirror 24 coincides with the forward focus of said first lens, the laser beam travels from the first lens toward the second lens in a direction parallel to the optic axis. Since the rearward focus of the second lens of the lens system 26 coincides with the reflecting surface of the reflecting mirror 28, the laser beam is imaged on the reflecting surface of the reflecting mirror 28 by said second lens.

Figure 3:
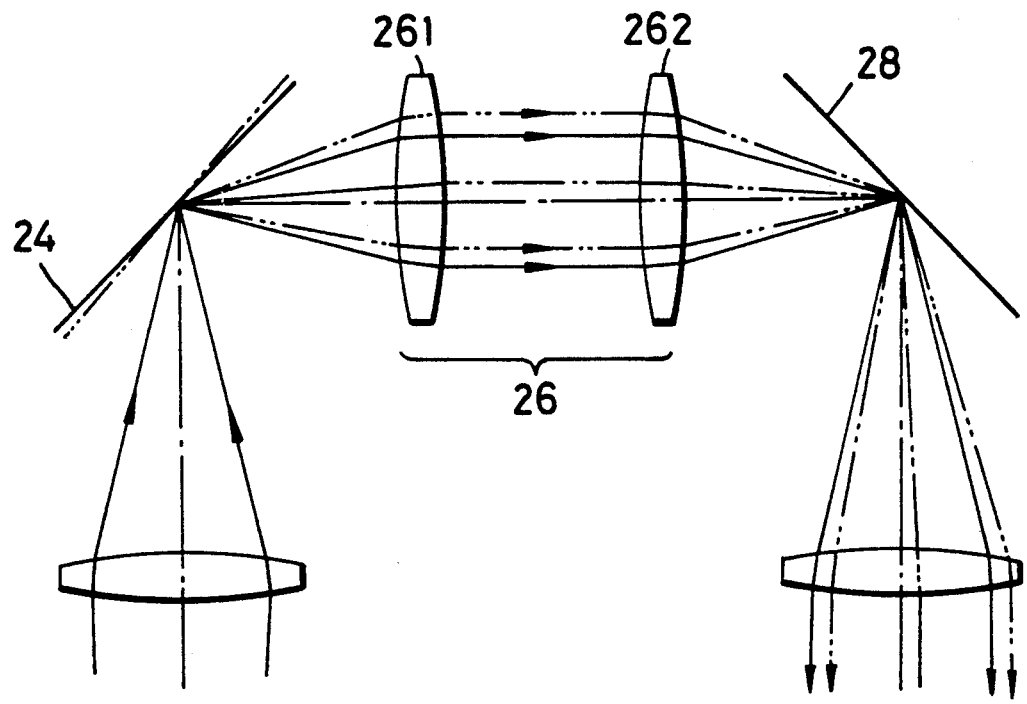
FIG. 3 is a diagrammatic view showing the performance of the invention when the optical path deviates due to change in inclination of a mirror.

Let it be assumed that the inclination or angle of the reflecting surface of the mirror 24 has changed slightly for some reason or other. For example, if the mirror 24 is slightly inclined as indicated by phantom line in FIG. 3, the direction of the laser beam reflected by the reflecting surface thereof changes by an angle twice as great as the inclination of the mirror 24. However, in spite of the change in the direction of the laser beam, the first lens 261 of the lens system 26 refracts the laser beam in a direction parallel to the optic axis and transmits it to the second lens 262. Accordingly, in spite of the change in the inclination of the mirror 24, the second lens 262 images the laser beam at a predetermined position on the reflecting surface of the mirror 28.

The laser beam reflected by the mirror 28 is also imaged at a predetermined position on the reflecting surface of the mirror 32 by the action of the lens system 30 similar to that of the lens system 26, and further, the laser beams reflected by the mirrors 32 and 36 are also imaged at predetermined positions on the reflecting surface of the mirror 36 and the entrance opening 40, respectively, by similar actions of the lens systems 34 and 38.

Thus, even if the inclination or angle of the reflecting surface of any mirror in the transmitting system changes, the laser beam always enters a predetermined position on the entrance opening of the working apparatus and therefore, no loss of the quantity of light occurs.

In the above-described embodiment, a beam expander may be inserted in the light-transmitting optical path. Generally, an excimer laser has a rectangular beam cross-section. In that case, it is preferable that a so-called cylindrical expander having different conversion ratios in two planes containing the optic axis and orthogonal to each other be inserted at a location near the laser source to shape the rectangular laser beam into a square laser beam.

Further, where the waist position or the angle of divergence of the beam in said two planes orthogonal to each other differs, not a spherical lens but a cylindrical or toric lens may be used, whereby imaging may take place on each of the reflecting mirrors.

As described above, the exit opening of the laser source and the entrance opening of the exposure device are in an imaging relation. Accordingly, assuming that their imaging-ratio is 1:1, the angle of divergence of the transmitted laser beam is also preserved.

While in the above-described embodiment, the exit opening 20 of the laser source 10 is relayed to the entrance opening 40 of the exposure device 12, the design may be such that the optical image forming position on the laser source side required in the exposure device 12, for example, the waist position of the beam, is relayed.

What is claimed is:

1. An apparatus for transmitting a laser beam supplied from a laser source to a working apparatus, comprising:
a plurality of reflecting mirrors disposed in series between said laser source and said working apparatus to change the direction of said laser beam;
a condensing optical system provided to condense said laser beam on the reflecting surface of the first one of said reflecting mirrors; and
a relay optical system including first and second imaging means disposed between said first reflecting mirror and the second reflecting mirror subsequent thereto in the direction of travel of said laser beam, said first imaging means being disposed between said first reflecting mirror and said second imaging means and having a forward focus substantially coincident with the reflecting surface of said first reflecting mirrors, said second imaging means being disposed between said first imaging means and said second reflecting mirror and having a rearward focus substantially coincident with the reflecting surface of said second reflecting mirror;
wherein said laser source has an exit opening for emitting said laser beam therethrough, said working apparatus has an entrance opening for introducing said laser beam thereinto, and said relay optical system further includes means for causing said laser beam reflected by said second reflecting mirror to be condensed on the entrance opening of said working apparatus, and wherein said relay optical system forms the image of the exit opening of said laser source on the entrance opening of said working apparatus.

2. An apparatus according to claim 1, wherein said first and second imaging means each are formed by a lens having a positive power.

3. An apparatus for transmitting a laser beam emitted from the exit opening of a laser source to the entrance opening of a working apparatus, comprising:
a first reflecting mirror having a reflecting surface opposed to the exit opening of said laser source and provided to bend the optical path of said laser beam;
a condensing optical system provided between said laser source and said first reflecting mirror to condense said laser beam on the reflecting surface of said first reflecting mirror;
a second reflecting mirror having a reflecting surface opposed to the entrance opening of said working apparatus and provided to bend the optical path of the laser beam incident on said reflecting surface and direct the laser beam to said entrance opening;
a relay optical system including first imaging means having a forward focus on the reflecting surface of said first reflecting mirror and second imaging means having a rearward focus on the reflecting surface of said second reflecting mirror, said relay optical system being provided between said first reflecting mirror and said second reflecting mirror to relay said laser beam condensed on the reflecting surface of said first reflecting mirror onto the reflecting surface of said second reflecting mirror; and
an imaging optical system provided between said second reflecting mirror and said working apparatus to condense the laser beam condensed on the reflecting surface of said second reflecting mirror on said entrance opening;

wherein said condensing optical system forms the image of said exit opening on the reflecting surface of said first reflecting mirror, said relay optical system relays the image on the reflecting surface of said first reflecting mirror onto the reflecting surface of said second reflecting mirror, and said imaging optical system forms the image on the reflecting surface of said second reflecting mirror on said entrance opening.

4. An apparatus according to claim 3, wherein said first and second imaging means are formed by a lens having a positive power.

5. An apparatus for transmitting a laser beam emitted from the exit opening of a laser source to the entrance opening of a working apparatus, comprising:

a series of spaced mirrors disposed to define a bent optical path for said laser beam from said laser source to said working apparatus, said series of mirrors including at least one pair of consecutive mirrors defining therebetween a straight portion of said optical path;

imaging means disposed between the mirrors of said pair along said straight portion of said optical path, said imaging means having a primary focal point substantially on a first mirror of said pair at a predetermined position thereon from which said laser beam is reflected and having a secondary focal point substantially on a second mirror of said pair at a predetermined position thereon from which said laser beam is reflected; and an imaging optical system provided between the final mirror of said series and said working apparatus to condense the laser beam from said final mirror on said entrance opening of said working apparatus and to form the image of the exit opening of said laser source on said entrance opening.

6. An apparatus according to claim 5, wherein said series of mirrors includes successive pairs of consecutive mirrors, each pair defining therebetween a straight portion of said optical path, and each pair having imaging means disposed between the mirrors thereof along the straight portion of the optical path thereof, each imaging means having a primary focal point substantially on a first mirror of the respective pair at a predetermined position thereon from which said laser beam is reflected and having a secondary focal point substantially on a second mirror of the respective pair at a predetermined position from which said laser beam is reflected.

7. An apparatus according to claim 6, further comprising means for condensing said laser beam from said laser source at a predetermined position on an initial mirror of said series from which said laser beam is reflected, said initial mirror being the first mirror of an initial pair of said consecutive mirrors, and said final mirror being the second mirror of a final pair of said consecutive mirrors.

8. An apparatus according to claim 5, wherein said imaging means comprises a pair of lenses arranged sequentially, wherein said primary focal point is the primary focal point of a first of said lenses, said secondary focal point is the secondary focal point of a second of said lenses, and wherein light from said primary focal point to said secondary focal point is transmitted between said lenses along paths parallel to said straight portion of said optical path.

9. An apparatus for transmitting a laser beam emitted from the exit opening of a laser source to the entrance opening of a working apparatus, comprising:

a series of mirrors defining a bent optical path for said laser beam from said laser source to said working apparatus, an initial mirror of said series being opposed to the exit opening of said laser source, and a final mirror of said series being opposed to the entrance opening of said working apparatus;

a condensing optical system provided between said laser source and said initial mirror o condense said laser beam on said initial mirror and to form an image of said exit opening thereon; and an imaging optical system provided between said final mirror and said working apparatus to condense the laser beam from said final mirror on said entrance opening of said working apparatus and to form the image of the exist opening of said laser source on said entrance opening;

said series of mirrors including successive pairs of consecutive mirrors, each pair defining therebetween a straight portion of said optical path, and each pair having imaging means disposed between the mirrors thereof along the straight portion of the optical path thereof, each imaging means having a primary focal point substantially on a first mirror o the respective pair at a predetermined position thereon from which said laser beam is reflected and having a secondary focal point substantially on a second mirror of the respective pair at a predetermined position from which said laser beam is reflected.

* * * * *